(12) United States Patent
Mekky et al.

(10) Patent No.: US 11,736,230 B1
(45) Date of Patent: Aug. 22, 2023

(54) DIGITALLY-CONTROLLED QUADRATURE CORRECTION LOOP

(71) Applicant: Cadence Design Systems, Inc., San Jose, CA (US)

(72) Inventors: Rania Hassan Abdellatif Abdelrahim Mekky, Montreal (CA); Jean-Francois Delage, Montréal (CA); Guillaume Fortin, Montréal (CA)

(73) Assignee: Cadence Design Systems, Inc., San Jose, CA (US)

( * ) Notice: Subject to any disclaimer, the term of this patent is extended or adjusted under 35 U.S.C. 154(b) by 263 days.

(21) Appl. No.: 17/305,578

(22) Filed: Jul. 9, 2021

(51) Int. Cl.
| | |
|---|---|
| *H04L 1/00* | (2006.01) |
| *H03K 19/017* | (2006.01) |
| *H03K 19/0185* | (2006.01) |
| *H03K 19/21* | (2006.01) |
| *H04L 7/00* | (2006.01) |
| *H04L 27/38* | (2006.01) |
| *H04L 1/1607* | (2023.01) |
| *H04L 7/033* | (2006.01) |
| *H04L 27/00* | (2006.01) |

(52) U.S. Cl.
CPC ..... *H04L 1/0045* (2013.01); *H03K 19/01742* (2013.01); *H03K 19/018521* (2013.01); *H03K 19/21* (2013.01); *H04L 1/0033* (2013.01); *H04L 1/1678* (2013.01); *H04L 7/0087* (2013.01); *H04L 7/0331* (2013.01); *H04L 27/3854* (2013.01); *H04L 2027/0065* (2013.01)

(58) Field of Classification Search
CPC ... H04L 1/0045; H04L 1/0033; H04L 1/1678; H04L 7/0087; H04L 7/0331; H04L 27/3854; H04L 2027/0065; H03K 19/01742; H03K 19/018521; H03K 19/21
See application file for complete search history.

(56) References Cited

U.S. PATENT DOCUMENTS

| | | | |
|---|---|---|---|
| 10,547,298 B1 | 1/2020 | Mekky et al. | |
| 2008/0036509 A1* | 2/2008 | Jang | H03K 5/135 327/141 |

* cited by examiner

*Primary Examiner* — Kyle Vallecillo
(74) *Attorney, Agent, or Firm* — Schwegman Lundberg & Woessner, P.A.

(57) ABSTRACT

A method and system for performing a duty cycle correction and quadrature error correction for a quarter-rate architecture TX/RX communication system, including correcting a duty cycle error between a first clock signal and a second clock signal, and correcting a quadrature error between a third clock signal and a fourth clock signal.

20 Claims, 7 Drawing Sheets

DIGITALLY-CONTROLLED QUADRATURE CORRECTION LOOP

TECHNICAL FIELD

Embodiments of the present disclosure relate to systems and methods for a digitally-controlled quadrature correction loop in accordance with some embodiments.

BACKGROUND

Conventional high-speed serial communication systems include various components that are used by the receiving device to receive, filter, recover, and correct errors in the data signal from the transmitter. Many serial receiver systems perform decision feedback equalization (DFE) on received data. Such serial receiver systems can include (i) an analog front end that provides some continuous time linear equalization (CTLE), (ii) a sampler, (iii) a DFE that uses the quantized received data to adaptively feedback a correction signal, and (iv) a timing recovery unit. The timing recovery unit can use edge samples of the signal to determine if the received timing is early or late (e.g., via phase detection). This information can be forwarded to a digital loop filter which outputs a controlling digital code into a phase interpolator circuit to generate a recovered clock signal. Proper alignment of such recovered clock signals is essential for achieving good data recovery performance.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

The following description of embodiments provides non-limiting representative examples referencing numerals to describe particular features and teachings of different aspects of the invention. The embodiments described should be recognized as capable of implementation separately, or in combination, with other embodiments from the description of the embodiments. A person of ordinary skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

In various digital systems, signals can be transmitted from a transmitter to a receiver via a transmission channel. The transmission channel can be any suitable wired or wireless medium which operably couples the transmitter to the receiver.

Serializer/deserializer ("SerDes") components are used on integrated system-on-a-chip (SoC) and application-specific integrated circuits (ASICs). The higher demand of high-speed, wide-band data rates can require high-speed serial data links or (TX/RX links) that are widely used for sending data over various media, such as cables, board traces and/or back-planes. These media are often referred to as channels. At high speeds, the design of a conventional full-rate RX architecture to meet such stringent specifications can pose many challenges. For example, a full rate 32 gigabytes-per-second (Gbps) RX has a clock frequency of 32 gigahertz (GHz) which can be difficult to generate. To achieve higher data rates in modern, very large scale integrated (VLSI) systems, half-rate and quarter-rate sampling approaches can be considered to reduce the speed requirement of circuits and power consumption.

Several circuits use dual-edge clock sampling to double the data-rate and increase the system bandwidth. Examples of these systems include double sampling analog-to-digital converters, double-data-rate (DDR), SDRAM (DDR3, GDDR5, XDR), half-rate Serdes transmitters, half-rate clock, and data recovery (CDR), among others. To achieve the desired timing margins in such applications, a 50% duty cycle clock can be needed. Additionally, some multiphase clocking systems, such as quarter rate Serdes TX and quarter rate CDRs, can require a precise 50% duty cycle clock.

In many instances including high data transmission speeds, the transmission channel becomes lossy. The transmitted signal can become lossy as a result of interference, attenuation, and delay in the channel, among other factors. Such losses can cause significant detrimental effects on the transmitted signal when it is recovered by the receiver.

Especially when the incoming signal suffers from impairments, the data and clock recovery mechanism's accuracy should be maximized to enhance link performance as much as possible. For example, performance limitations can result from sampling clock phase alignment errors. Thus, it is important to ensure proper alignment of the sampling clock phases to reduce or eliminate the performance limitations.

Quadrature error (phase skew) results from gain and phase imbalance in the mixer and base band components of a transceiver, or put more broadly, resulting from device and/or routing mismatches. To correct for such quadrature errors, a quadrature error correction (QEC) is applied.

Quadrature error (QE) is generally known as the deviation from 90° of any two sets of complementary clocks which are expected to lie in quadrature from one another (0° and 180° vs 90° and 270°), (45° and 225° vs 135° and 315°) and can also be referred to herein as clock skew.

The duty cycle distortion and the quadrature error are two orthogonal components of a clock signal. The differential duty cycle distortion is generally known as a deviation from 50% of the duty cycle of complementary clocks (0° and 180°), (90° and 270°), (45° and 225°), and (135° and 315°). The DCD can also be seen as a deviation from the 180° expected alignment between two complementary clocks.

However, the duty cycle of a differential clock or other signal can easily deviate because of the PVT (e.g., process, voltage, temperature) variations and fabrication mismatches in the pull-up and pull-down of devices in the buffer chain, different loads, delays in clock routing, layout mismatches, and others. Quarter-rate architecture TX/RX use a set of quadrature clocks (0°, 90°, 180°, 270°). Some RX architectures can use two sets (0°, 90°, 180°, 270°) and (45°, 135°, 225°, and 315°) with minimum differential DCD as well as minimal QE. Additional phase errors introduced between multiphase clocks degrade the valid data sampling window. Accordingly, methods and systems for a real-time correction of the DCD and QE are desired to maintain a desired duty cycle and clock phase angle.

To cover a wide range of frequencies, the correction granularity can be resized. For example, a correction range of 45%-55% for a frequency of 4 GHz corresponds to a time range of 25 ps whereas the same correction range at 8 GHz corresponds to a time range of 12.5 ps. As such, the correction range at 8 GHz is half that of the 4 GHz range. If a single range is used to cover both frequency bands (e.g., 4 GHz and 8 GHz), large correction steps are needed to cover the entire 25 ps range, resulting in less accurate correction at frequencies higher than 4 GHz and consequently higher jitter values. Conversely, when the range is optimized to achieve a low jitter at higher frequencies, the finer correction steps cannot cover the range needed at lower frequencies, resulting in a jitter-range tradeoff.

Due to tight jitter budget requirements, real time correction of the DCD and QE is highly desired. To that end, at least two independent negative feedback loops for DCD and one negative feedback loop for QE correction are contemplated herein for a set of quadrate clock phases. The three loops are orthogonal. It is understood that every number of combinations of DCD and QE correction loops are considered within the scope of this disclosure.

One conventionally implemented approach to minimize the duty-cycle distortion problem entails use of differential logic circuits. Differential logic circuits rely on voltage differences between pairs of clock signals to ensure proper assessment of clock signal levels and transitions. Further, conventional systems may perform DCD corrections and QE corrections at discrete physical locations within a SerDes circuit. As timing requirements get more stringent, DCD and QE corrections at multiple locations within a receiver device are desired, even though DCD and QE correction circuits are typically located within a specified physical location due to physical layout constraints as well as power consumption budgets.

To solve this technical problem, in some embodiments of the present disclosure, the methods and systems described herein contemplate a solution including multiple DCD correction feedback circuits operably coupled with one or more QE correction feedback circuits to provide clock signal error correction in quarter-rate systems. As such, DCD and QE correction circuits can be partitioned into an actuation portion and a sensing portion, where the sensing portion is usually placed near an end point in a clock distribution tree where clock alignment matters the most, and where the actuation portion can be placed somewhere else along that clock tree. Additionally, the actuation and error sensing need not occur at the same physical location.

Within the context of this disclosure, it is understood that duty cycle distortion (DCD) is described as being corrected by duty cycle correction (DCC) circuit(s) as well as quadrature error (QE) being corrected by quadrature error correction (QEC) circuit(s).

It is understood that the methods and systems described herein are explained in detail with respect to quarter-rate systems, namely a receiver (RX) architecture, but are not solely limited to implementation in RX quarter-rate systems.

According to certain aspects, embodiments provide a method for implementing a digitally controlled quadrature error correction loop and/or a digitally controlled duty cycle correction error loop. The method includes correcting, by a duty cycle correction circuit, a duty cycle error between a first clock signal and a second clock signal which are differential, and correcting, by the quadrature error correction circuit, a quadrature error between the first differential clock signal pair and the second differential clock signal pair. It is noted, that the first and second clock signal for the duty cycle correction circuit is distinct from the first and second differential clock signal pair of the quadrature error correction circuit.

In some embodiments, the error correction circuit includes a clock generator configured to generate a plurality of clock signals, a duty cycle correction loop configured to correct a duty cycle error of differential clock signals from the clock generator, and a quadrature error correction loop configured to correct a quadrature error between a first and a second differential clock signal pair from the clock generator.

Figure 1:
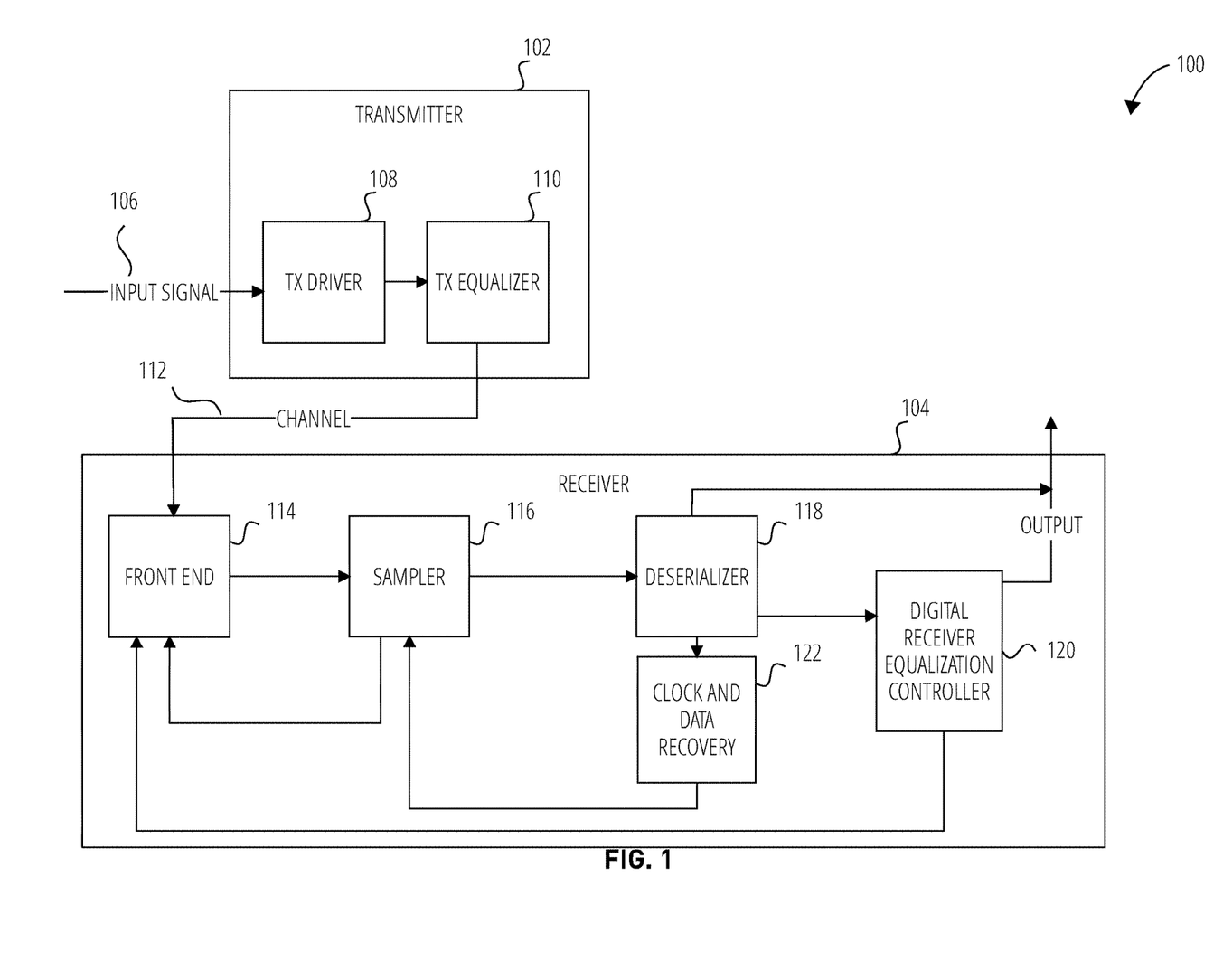
FIG. 1 illustrates a block diagram of a high-speed transmission system in accordance with some embodiments.

FIG. 1 is a block diagram of a communication system in accordance with some embodiments. The system 100 can include a transmitter 102, a receiver 104, and at least one channel 112 connecting the transmitter 102 to the receiver 104. In some embodiments, the transmitter 102 and the receiver 104 can be implemented in one or more integrated circuits (ICs). The channel 112 can be unidirectional or bidirectional and can transmit data using a positive and negative polarity data signal. A single-ended implementation is also possible.

The transmitter 102 receives an input signal 106 to be transmitted and transmits a representation of the input signal 106 using a transmission (TX) driver 108. The system 100 can be a serial communication system, in which the input signal 106 can be serialized before or after being input to the transmitter 102. The TX driver 108 can form a differential signal based on the input signal 106. The differential signal can have a specified amplitude, the value of which can vary depending on the communication standard by which the transmitter 102 communicates with the receiver 104.

The transmitter 102 can include a TX equalizer 110, which can be implemented using a feed-forward equalizer (FFE) having adjustable tap weights. In some embodiments, the TX equalizer 110 and Tx driver 108 are combined into a single circuit block.

The input to receiver 104 can be processed through a front end 114, which can include a linear and/or non-linear equalizer with programmable gain and/or frequency shaping, a sampler 116, and a deserializer 118.

The front end 114 can also receive outputs from a clock and data recovery module 122, optionally from digital receiver equalization controller 120, and from a sampler 116 to implement for example, a decision feedback equalizer (DFE). Specifically, the front end 114 sums the weighted and delayed outputs from the sampler 116 to the received signal. The weight values are determined by the digital receiver equalization control. In an embodiment, the sampler 116 samples and quantizes the received signal to generate in-phase (I) and quadrature (Q) samples over a series of predetermined unit intervals (UI), with each Q sample being interleaved between consecutive I samples. Further, the sampler 116 samples the received signal based on a plurality of clock signals output from the clock and data recovery unit. In an embodiment, the sampler 116 sends the sampled data to the front end 114 and deserializer 118.

The deserializer 118 deserializes the quantized data and provides the deserialized data to the clock and data recovery unit 122. In some embodiments, the deserializer 118 samples the quantized data at the edge of the I sample and the center of the I sample. In some embodiments, the deserialization paths are different between the clock recovery and data recovery paths, as the digital (RTL) portion of the clock recovery path typically runs at a higher clock rate than the digital portion of the data path to reduce latency in the clock recovery loop. Data on the clock recovery path may be pre-processed by the deserializer to ease the processing burden at the CDR digital filter.

In some embodiments, the digital receiver equalization controller 120 carries out predetermined control processing for the equalization utilized by the receiver 104 based on data received from the deserializer 118 and feeds back various equalization information to the front end 114 to perform the corrective operation. For example, the digital receiver equalization controller 120 sends the DFE weights, the VGA gain, and the CTLE settings to the front end 114. As part of a feedback equalizer, the sampler 116 generally makes a logic 1 or 0 decision on the sample data—the decision is scaled and delayed and then fed back to the front end 114 where it is added back into the received data. Therefore, the DFE establishes a feedback loop where the decision is made in that loop.

The clock and data recovery unit 122 receives an input from deserializer 118 and generates a plurality of sampling clocks to provide to the sampler 116. The clock and data recovery unit 122 also receives the I and Q data samples from the deserializer 118 and based on the I and Q data, determines if the sampler 116 is running too slow or too fast. To correct the late or early clock rate of the sampler 116, the clock and data recovery unit 122 can move the sampling clocks forward or backwards in discrete time steps at certain update points in time. In some embodiments, the sampling clocks can be steered forward or backwards in a continuous fashion.

A clock and data recovery unit 122 can include a phase detector, a loop filter, and a phase interpolator in accordance with some embodiments. The phase detector can be configured to receive a plurality of deserialized data samples from the deserializer 118. In some embodiments, the deserializer 118 transmits deserialized I and Q data samples to the phase detector. Based on the received data samples (i.e., I, Q), the phase detector will generate one of an early, late, or no update signal. For example, to represent an early signal, the phase detector can generate a value of "01" to represent a late signal, the phase detector can generate a value of "10", and to represent that no update is needed, the phase detector can generate a value of "00." In some embodiments, the phase detector performs the early/late analysis for each of then numbers of deserialized samples of the I, Q=data samples. In further embodiments, the phase detector is partly embedded inside deserializer function in order to minimize the latency of the clock recovery loop. As such, the deserializer may provide de-serialized early/late samples to digital loop filter.

Accordingly, the phase detector (or deserializer) will provide N early/late signals to the loop filter for processing where the loop filter determines if, over a certain period of time, the received early/late signals include a majority of early signals or a majority of late signals. Based on this determination, the loop filter generates one of an early or late signal to transmit to the phase interpolator. The loop filter in some embodiments can add the early/late signals over the period of time and based on the sign of the sum, generate one of an increment or decrement signal. For example, an early signal is associated with a "+1" and a late signal is associated with a "−1," and the signals requiring no updates are associated with "0". If the sum of all of the early/late signals is associated with a positive sign, or a value greater than 0, it is assumed that the majority of the early/late signals were early signals. Similarly, if the sum of all of the early/late signals is associated with a negative sign or a value less than 0, it can be assumed the majority of the signals were late signals. This early/late signal is filtered digitally. In some embodiments, the phase interpolator modifies the phase of the plurality of clocks being provided to the sampler 116 based on the received early or late signal. For example, if the loop filter transmits an early signal, the phase interpolator decrements the phase of the plurality of clocks. In some embodiments, decreasing the phase implies that the phase of the sampler clock is shifted earlier in time. Similarly, if the loop filter transmits a late signal, the phase interpolator increments the phase of the plurality of clocks and the phase of the sampler clock is shifted later in time. In some embodiments, after modifying the clocks, the phase interpolator provides the modified clocks to the sampler 116.

Figure 2:
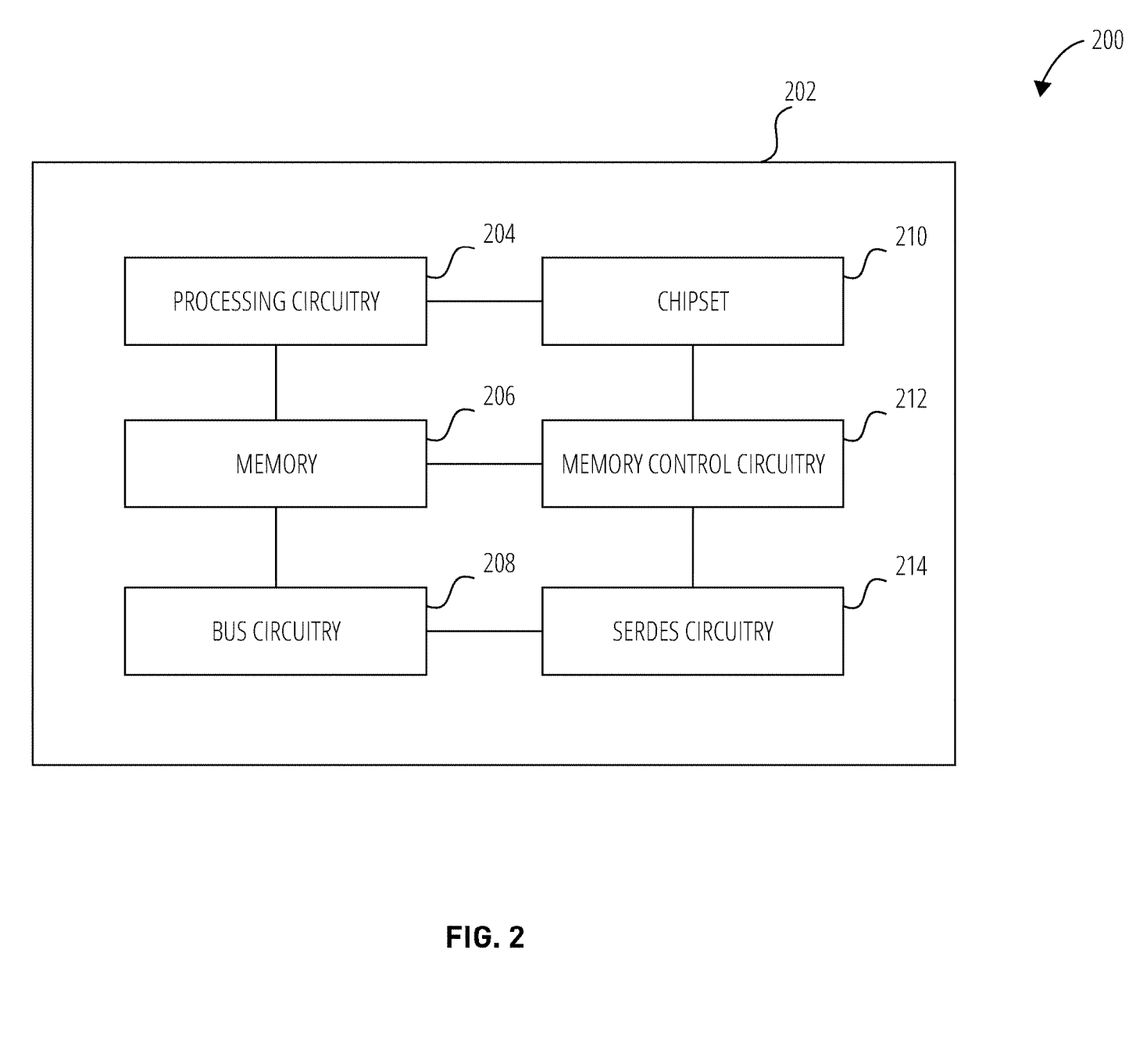
FIG. 2 illustrates a block diagram of an integrated circuit (IC) in accordance with some embodiments.

FIG. 2 is a block diagram 200 of an example integrated circuit (IC) 202 in accordance with some embodiments. The term "integrated circuit" as used herein can refer to a semiconductor device and/or microelectronic device, such as, for example, but not limited to, a semiconductor integrated circuit chip. The specific configuration, arrangement, and components shown in IC 202 are provided merely for exemplary purposes as additional and/or alternative configurations are also within the scope of the present disclosure.

In some embodiments, the IC 202 can include core processing circuitry 204, which can include one or more of any suitable processors. The IC 202 can also include chipset 210. In some embodiments, the chipset 210 can include both Northbridge/memory controller hub (MCH) and Southbridge I/O controller hub (ICH) circuitry. These components can be included within the chipset 210 or at any other location within the IC 202.

The IC 202 can also include memory 206, which can be in communication with core processing circuitry 204. Memory 206 can comprise one or more of the following types of memories: semiconductor firmware memory, programmable memory, non-volatile memory, random access memory, flash memory (including NAND and/or NOR type memory architectures), magnetic disk memory, and/or optical disk memory. Either additionally or alternatively, memory 206 can comprise other and/or future developed types of computer-readable memory.

IC 202 can additionally include memory control circuitry 212 configured to provide compatibility with a variety of different bus circuitry 208, including, but not limited to, Universal Serial Bus (USB), Serial Advanced Technology Attachment (SATA), Peripheral Component Interface (PCI), PCI-Express, and System Management Bus (SMBus). The IC 202 can also include SerDes circuitry 214, which can include numerous components configured to transmit/receive one or more high-speed data signals.

Figure 3:
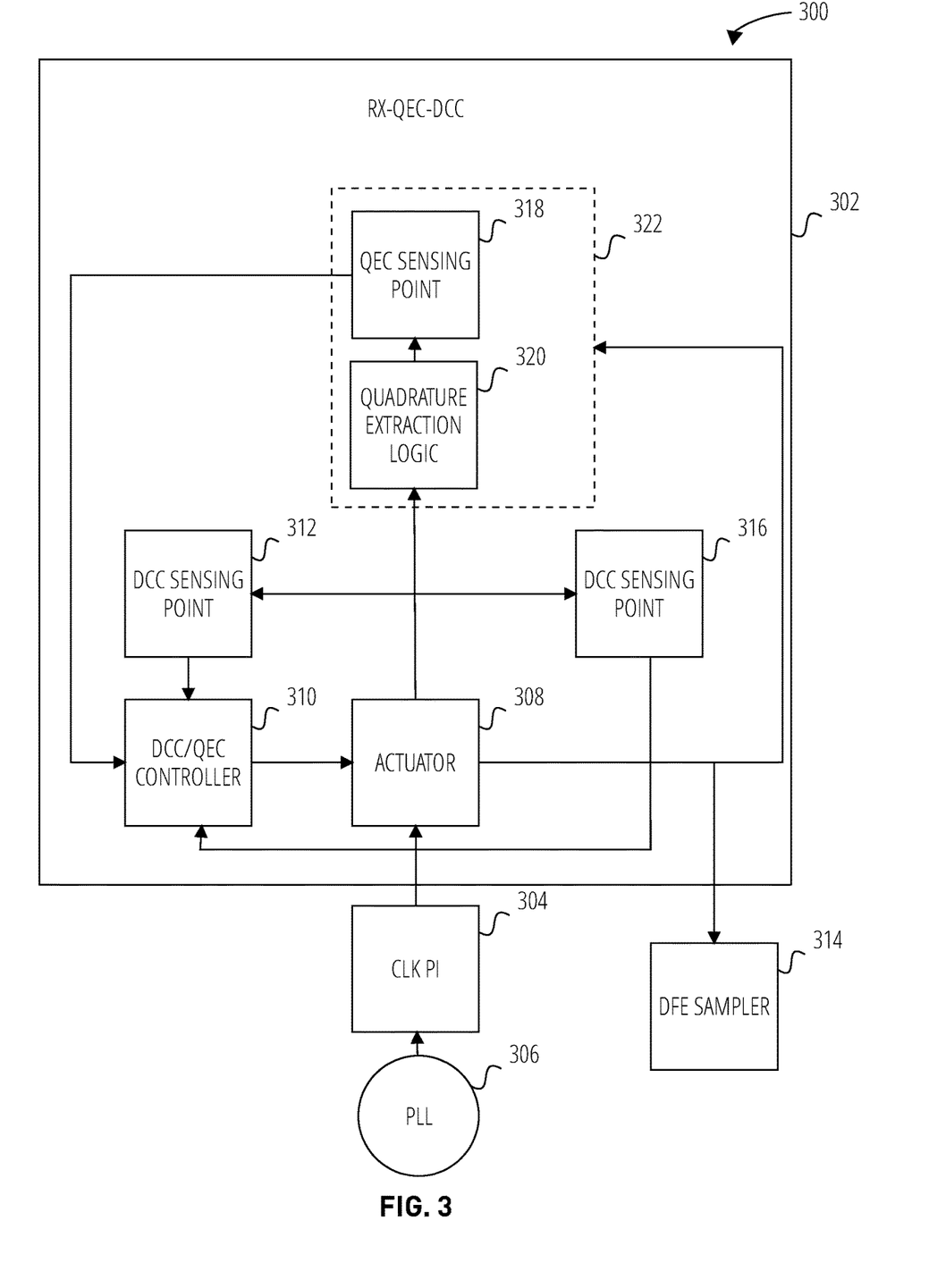
FIG. 3 illustrates a block diagram of an error corrector circuit in accordance with some embodiments.

FIG. 3 illustrates a block diagram of a clock phase error corrector circuit in accordance with some embodiments.

The receiver system 300 includes a clock phase error correction circuit 302 (e.g., QEC/DCC circuit) coupled to a phase-locked loop 306 and a phase interpolator 304. The error correction circuit 302 includes an actuator 308 that includes blenders and the DC correctors, DCC sensing points 312 and 316, DCC/QEC controller 310, quadrature extraction logic 320, and QEC sensing point 318.

The phase-locked loop (PLL) 306 is an example of a signal source configured to generate a clock that can be converted to complementary clocks. In some embodiments, the clock signal from the phase-locked loop (PLL) 306 is divided for further processing.

The phase interpolator 304 is configured to optimize the alignment of the clocks provided by phase-locked loop (PLL) 306 with respect to the incoming data. In some embodiments, the phase interpolator 304 is configured to receive quadrature clock signals and mixes them to generate output clocks with a controlled phase offset relative to the input quadrature clocks. The phase adjustment range of the output clocks typically cover a full 360°, but usually more to track for frequency differences between the far end and near end reference clocks.

The actuator 308 includes blenders and the DC correctors which, in some embodiments, acts as a CML to CMOS converter. It has also one or more configurable current sources to adjust the DCC range. The actuator 308 includes blenders and DC correctors cascaded to provide a combined QEC/DCC correction over the clock signals. As explained in further detail with respect to FIG. 4, the DC corrector circuit includes a plurality of configurable current sources to digitally adjust an error correction step size. Additionally, the blender circuits are used for applying a QE correction. The DCC/QEC actuators 308 can provide corrections that cover an octave of frequencies (e.g., 4 GHz-8 GHz) by use of CML blenders for QE correction.

In some embodiments, the CML blenders receive a calibration code that adjusts their output edge rates to ensure optimal linearity over a wide range of frequencies (e.g., 4 GHz-8 GHz). The CML blenders can also be designed to provide a skew correction range wide enough to accommodate both QE corrections as well as adjustment of the skew between D and Q clocks. The clock phases of opposite polarity (e.g., 0°/180°) are kept differential through the use of simple back-to-back, aka fly-wheel, inverters. This enables the use of differential sensing, which simplifies overall architecture.

The DFE sampler 314 processes an input signal and digitizes the input signal in to a two-state numerical value. In some embodiments, the DFE sampler 314 is configured to modify the signal to produce an output signal that minimizes an intersymbol interference (ISI) at the clock sampling times. The DFE sampler 314 is configured to sample data at clock edges with a threshold that is set by a correction voltage. Optimal alignment of the clocks driving the DFE sampler is essential for maximizing the jitter tolerance of a receiver.

The DCC sensing points 312 and 316 can be located at various locations within the circuit 302 that are used to sample and correct clock signals. Each DCC sensing point can include a low-pass filter configured to receive two inputs (e.g., a differential clock pair having complementary phase angles). The two outputs of the filter are fed to a comparator to determine whether the duty cycle of the clock signals is to be corrected. The comparator can assess the differential duty cycle of a differential clock driving the low-pass filter by comparing the average voltages of the two filter outputs. In some embodiments, an input clock signal to a component within a receiver (e.g., receiver 104) is a clock signal. Before the input clock signal is applied to the component, a QEC/DCC correction is to be applied, which is controlled by DCC/QEC controller 310.

The DCC sensing point (e.g., sensing point 312, 316) is at a physical location in a vicinity of the input clock signal to the component, or within a reasonable set distance between the input clock signal and the component. In some embodiments, both the DCC and QEC sensing points are at a same physical location. Each DCC sensing point can be activated in order to enforce a duty-cycle correction at the sensing point. Although not shown, the receiver system 300 can include multiple DCC sensing points at different locations (e.g., 3 sensing points). In addition, one location may include multiple sensing points (e.g., DCC and QEC sensing points).

The DCC/QEC controller 310 includes a digital controller configured to provide DCC and QEC correction codes to the actuator 308. In some embodiments, the DCC correction codes adjust one or more configurable current sources of the actuator 308. The DCC/QEC controller 310 is a digital controller that has the ability for fast startup from a sleep-mode. Additionally, the DCC/QEC controller 310 is able to correct the clock signal at various locations by selecting which DCC/QEC sensing points it wishes to perform the corrections. The DCC/QEC controller 310 can assess the duty cycle error and/or the quadrature error of each active DCC/QEC sensing point by comparing the average output value of the sensing point comparator with a target threshold. The target threshold is typically set as a ratio of 50% ones and 50% zeros to achieve optimal duty cycle and quadrature spacings.

QEC correction 322 receives inputs from actuator 308 and includes logic 320 and QEC sensing point 318. In some embodiments logic 320 includes an XOR gate coupled to clocks feeding into the DCC sensing points 312 and 316 and DFE sampler 314; the XOR gate outputs in turn feed into the QEC sensing point 318. The quadrature extraction logic 320 is configured to double the frequency of the clock signal to be fed as an input to the QEC sensing point 318. Additionally, the quadrature extraction logic 320 can be configured to convert a quadrature error at its input into a differential DCD at its output.

The QEC sensing point 318 includes a low-pass filter configured to receive two inputs (a first and a second clock signal, typically at distinct phase angles) and a comparator to compare the outputs of the low-pass filter. The QEC sensing point 318 can operate in a similar manner as the DCC sensing points 312 and 316. The output of the QEC sensing point is provided to the DCC/QEC controller and the QE is adjusted by the blender inside actuator 308. In some embodiments, the architecture of system 300 allows not only the QE corrections for one set of clocks (e.g., D or Q) but also a correction between two clock sets (e.g., D and Q).

Figure 4:
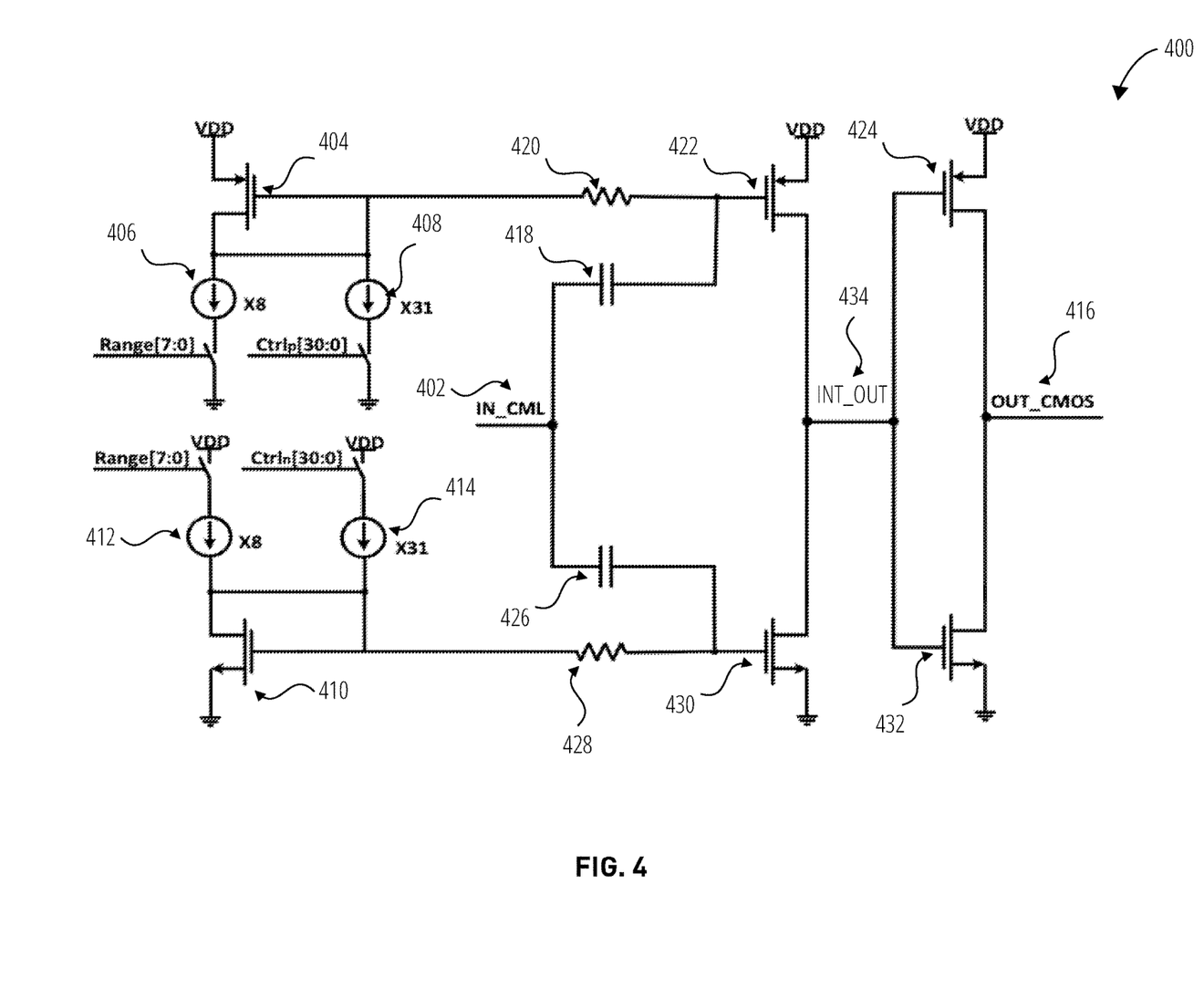
FIG. 4 illustrates an example DCC actuation circuit in accordance with some embodiments.

FIG. 4 illustrates an example DC corrector circuit in accordance with some embodiments. Circuit 400 includes a current mode logic (CML) to CMOS conversion circuit to convert CML level signals for CMOS level signals. The DCC is integrated in the CML-to-CMOS block by adjusting the DC average of the CMOS level using configurable current sources. This integration enables a power and jitter efficient implementation.

The circuit 400 is configured to perform duty cycle corrections (DCC) and has a digitally configurable correction range. The circuit 400 receives an input signal 402 (e.g., clock signal) and provides a non-inverted output signal 416. As part of the CML to CMOS converter circuit is a DCC circuit having a PMOS transistor 404 coupled to parallel current sources 406, 408. The current sources 406 and 408 are pull-down current sources configured to supply the necessary current to adjust the duty cycle of the output signal. The current sources 412 and 414 are coupled to NMOS transistor 410 and are respectively pull-up current sources that are similarly configured to adjustably supply the necessary current to pull down the current to correct the duty cycle error.

The capacitors 418 and 426 decouple the average voltage and couple high-frequency variation of the input signal 402. A new average voltage at the gate of the PMOS transistor 422 is set by the resistor 420. Similarly, a new average voltage at the gate of the NMOS transistor 430 is set by the resistor 428. The values of the new average voltages are based on the number of current sources connected from 406 and 408 (for the gate of the PMOS transistor 422) and from 412 and 414 (for the gate of the NMOS transistor 430). The transistors 422 and 430 act as common-source amplifiers for the input signal. The transistors 424 and 432 compose a CMOS inverter to settle the output signal 416 from rail-to-rail.

In some embodiments, the current sources 406 and/or 412 are responsible for the DCC range control and the current source 408 and/or 414 are responsible for the DCC error correction.

The DCC range can be configured by controlling the rise/fall times of the intermediate output signal 434 by controlling the average voltages of transistors 422 and 430 by controlling the current sources 406 and 412. Both current sources have the same control bits, and they change based on the running protocol. The reconfigurable DCC range enables a wide range of operation for wide range of clock frequencies.

The reconfigurable DCC range enables wide range of operation for wide range of clock frequencies. The range of the DCC loop can be extended to accommodate lower-frequency clocks. For the high-frequency clocks, the range can be reduced to reduce the jitter values. As a result, the jitter-range tradeoff can be solved.

The control bits of current sources 408 and 414 are updated by the negative feedback loop and are digitally configurable by a controller (e.g., DCC/QEC controller 310). Based on a number of current sources being connected to the NMOS 410 and PMOS 404, the circuit 400 can correct a duty cycle of the input signal while converting the output signal with the corrected duty cycle to a CMOS level.

Figure 5:
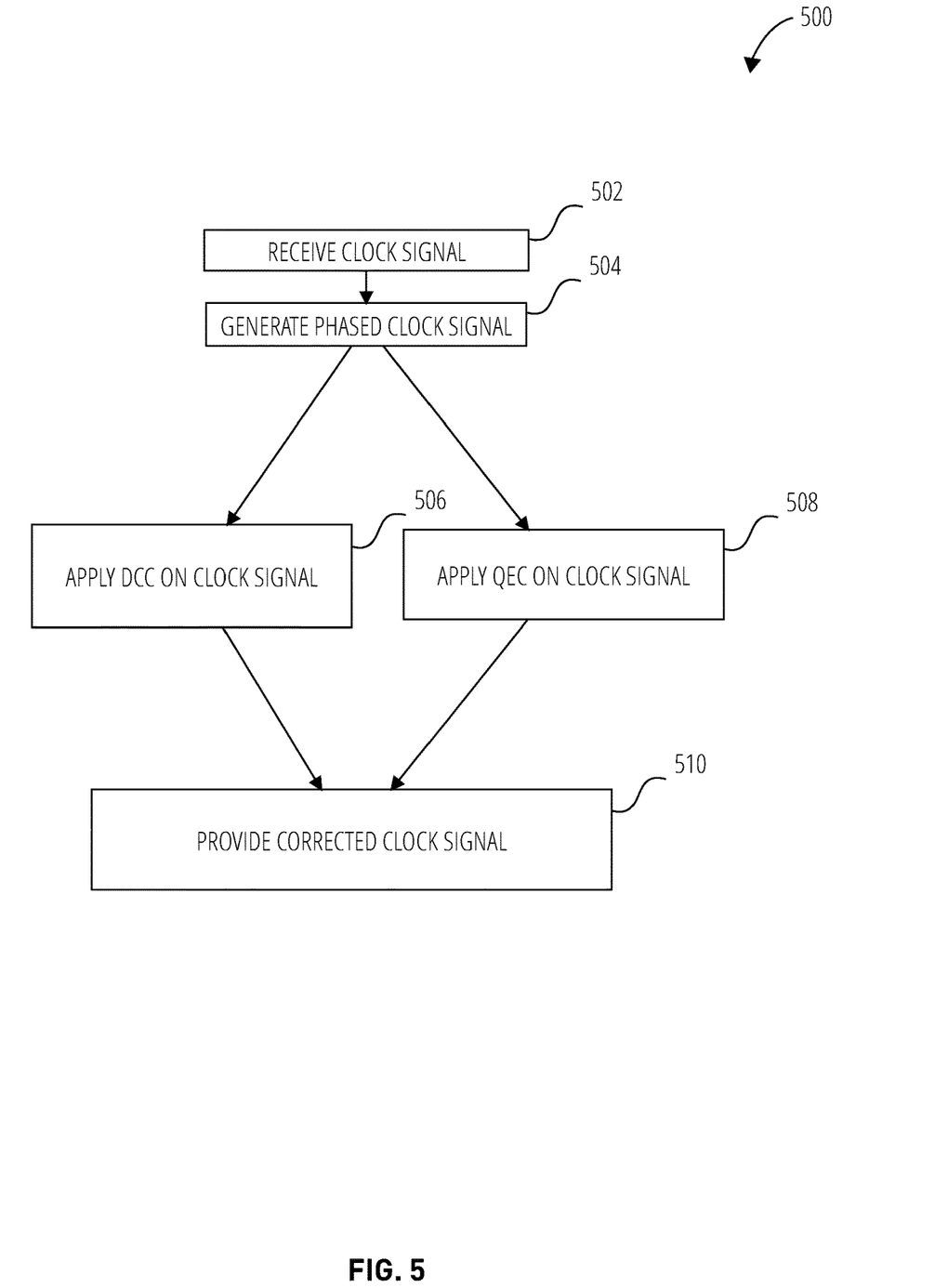
FIG. 5 illustrates a flowchart illustrating an example methodology of applying signal corrections in accordance with some embodiments.

FIG. 5 illustrates a flow diagram of a method implementing a DCC and QEC circuit in accordance with some embodiments. Method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In some embodiments, method 500 begins at a receiver device (e.g., receiver 104) that receives a clock signal at operation 502. The clock signal is processed (e.g., by clock phase interpolator 304) to generate one or more phased clock signals. In a quarter-rate architecture, the clock signal is split into four distinct clocks at various phase angles. In some embodiments, the phase angles are 0° and 180°; 90° and 270°; 45° and 225°; and 135° and 315°.

After the clock signal is processed at operation 504, the method 500 can, in some embodiments, process the signal at operations 506 and 508 in parallel. A duty cycle correction (DCC) can be applied on the clock signal.

In some embodiments, the duty cycle correction loop is configured to correct the duty cycle between 45% and 55%.

A quadrature error correction (QEC) can also be applied on the clock signal. The application of the corrections (DCC) and (QEC) can be performed in series or in parallel. In some embodiments, a DCC is applied and a QEC is not applied. In some embodiments, a QEC is applied and a DCC is not applied. In some embodiments, a QEC is applied to a data (D) clock signal. Generally, a D clock signal is separated by 90° into a signal with 0°, 90°, 180°, and 270° phase angles.

In some embodiments, a QEC is applied to a Q clock signal. Generally, a Q clock signal also has a separation of 90° with 45°, 135°, 225°, and 315° phase angles.

Additionally, in some embodiments, further phase adjustments can be applied between the D and Q clock signals to optimize the sampling point of the incoming signal and maximize receiver jitter tolerance.

At operation 510, the corrected clock signal is provided. In some embodiments, the corrected clock signal is used in a negative feedback loop of the receiver 104.

Figure 6:
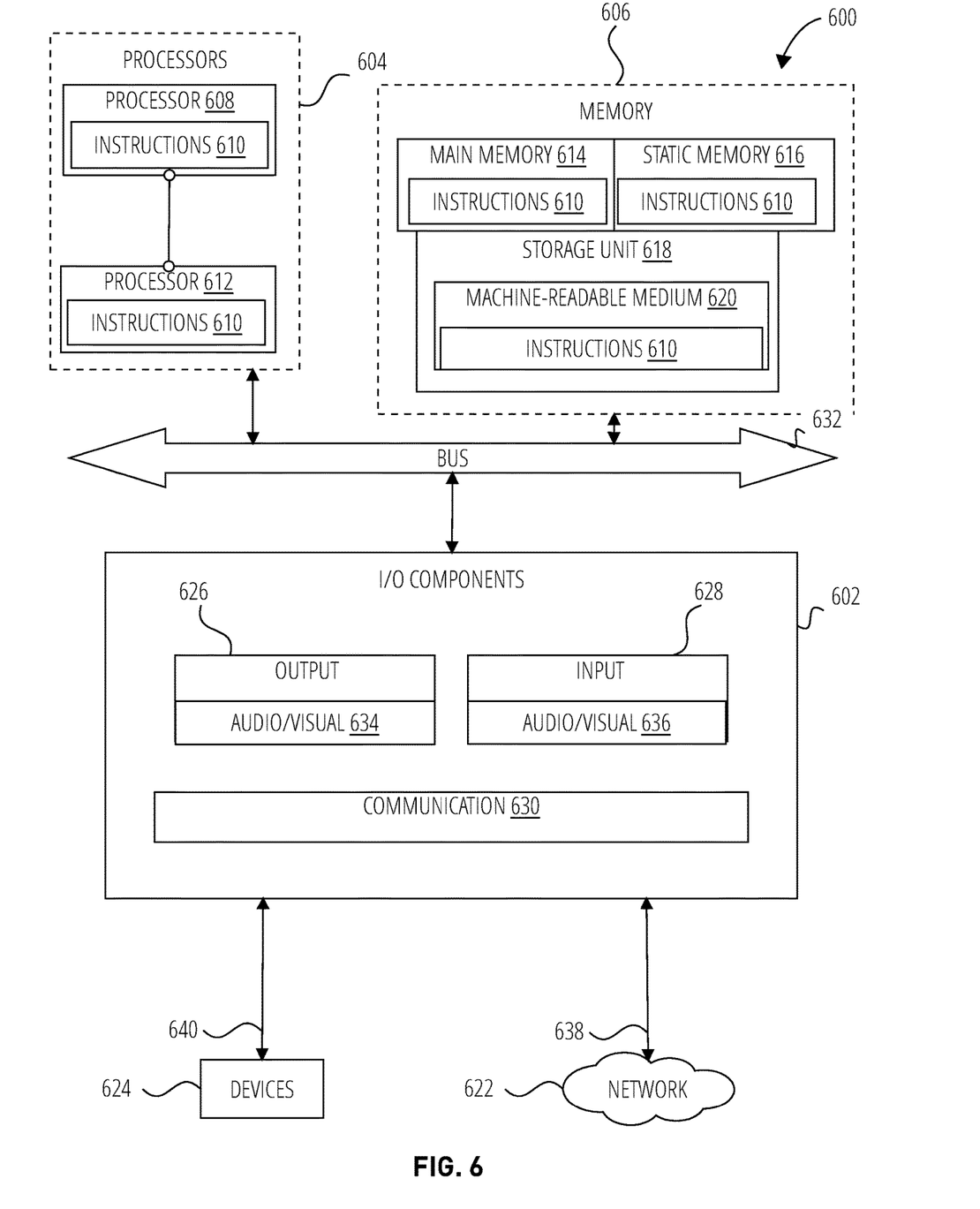
FIG. 6 is a block diagram of an example system for implementing a digitally-controlled quadrature correction loop in accordance with some embodiments.

FIG. 6 is a block diagram illustrating components of a device 600 according to some embodiments, able to read instructions 610 from a machine-readable medium (e.g., machine-readable storage medium or machine-readable storage device) and perform any one or more of the methodologies discussed herein. The instructions 610 can cause the device 600 to execute the method 500 illustrated in FIG. 5. Additionally, or alternatively, the instructions 610 can implement one or more of the components of FIG. 1-4. The instructions 610 transform the general, non-programmed device 600 into a particular device 600 programmed to carry out the described and illustrated functions in the manner described. In alternative embodiments, the device 600 operates as a standalone device or can be coupled (e.g., connected) to other machines.

The device 600 can comprise, but not be limited to, a server computer, a client computer, a personal computer (PC), a tablet computer, a laptop computer, a netbook, a PDA, or any machine capable of executing the instructions 610, sequentially or otherwise, that specify actions to be taken by device 600. Further, while only a single device 600 is illustrated, the term "machine" shall also be taken to include a collection of devices 600 that individually or jointly execute the instructions 610 to perform any one or more of the methodologies discussed herein.

The device 600 can include processors 604, memory/storage 606, and I/O components 602, which can be configured to communicate with each other such as via a bus 632. In an example embodiment, the processors 604 (e.g., a Central Processing Unit (CPU), a Reduced Instruction Set Computing (RISC) processor, a Complex Instruction Set Computing (CISC) processor, a Graphics Processing Unit (GPU), a Digital Signal Processor (DSP), an ASIC, a Radio-Frequency Integrated Circuit (RFIC), another processor, or any suitable combination thereof) can include, for example, processor 608 and processor 612 that can execute the instructions 610. The term "processor" is intended to include multi-core processor that can comprise two or more independent processors (sometimes referred to as "cores") that can execute instructions 610 contemporaneously. Although FIG. 6 shows multiple processors 604, the device 600 can include a single processor with a single core, a single processor with multiple cores (e.g., a multi-core process), multiple processors with a single core, multiple processors with multiples cores, or any combination thereof.

The memory/storage 606 can include a main memory 614, static memory 616, or other memory storage, and a storage unit 618, both accessible to the processors 604 such as via the bus 632. The storage unit 618 and memory 614 store the instructions 610 embodying any one or more of the methodologies or functions described herein. The instructions 610 can also reside, completely or partially, within the memory 614, within the storage unit 618, within at least one of the processors 604 (e.g., within the processor's cache memory), or any suitable combination thereof, during execution thereof by the device 600. Accordingly, the memory 614, the storage unit 618, and the memory of processors 604 are examples of machine-readable media including machine-readable storage device 620.

As used herein, "machine-readable medium" includes a machine-readable storage device 620 able to store instructions 610 and data temporarily or permanently and can include, but is not limited to, random-access memory (RAM), read-only memory (ROM), buffer memory, flash memory, optical media, magnetic media, cache memory, other types of storage (e.g., Erasable Programmable Read-Only Memory (EEPROM)) and/or any suitable combination thereof. The term "machine-readable medium" should be taken to include a single medium or multiple media (e.g., a centralized or distributed database, or associated caches and servers) able to store instructions 610. The term "machine-readable medium" shall also be taken to include any medium, or combination of multiple media, that is capable of storing instructions (e.g., instructions 610) for execution by a machine (e.g., device 600), such that the instructions, when executed by one or more processors of the device 600 (e.g., processors 604), cause the device 600 to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" excludes signals per se.

The input/output (I/O) components 602 can include a wide variety of components to receive input, provide output, produce output, transmit information, exchange information, capture measurements, and so on. The specific I/O components 602 that are included in a particular machine will depend on the type of machine. For example, portable machines such as mobile phones will likely include a touch input device or other such input mechanisms, while a headless server machine will likely not include such a touch input device. It will be appreciated that the I/O components 602 can include many other components that are not shown in FIG. 6. The I/O components 602 are grouped according to functionality merely for simplifying the following discussion and the grouping is in no way limiting. In various example embodiments, the I/O components 602 can include output components 626 and input components 628. The output components 626 can include audio/visual components 634 (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The input components 628 can include audio visual devices 636 having alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or other pointing instrument), tactile input components (e.g., a physical button, a touch screen that provides location and/or force of touches or touch gestures, or other tactile input components), audio input components (e.g., a microphone), and the like.

Communication can be implemented using a wide variety of technologies. The I/O components 602 can include communication components 630 operable to couple the device 600 to a network 622 or devices 624 via coupling 638 and coupling 640, respectively. For example, the communication components 630 can include a network interface component or other suitable device to interface with the network 622. In further examples, communication components 630 can include wired communication components, wireless communication components, cellular communication components, Near Field Communication (NFC) components, Bluetooth® components (e.g., Bluetooth® Low Energy), Wi-Fi® components, and other communication components to provide communication via other modalities. The devices 624 can be another machine or any of a wide variety of peripheral devices (e.g., a peripheral device coupled via a USB).

Moreover, the communication components 630 can detect identifiers or include components operable to detect identifiers. For example, the communication components 630 can include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF416, Ultra Code, UCC RSS-2D bar code, and other optical codes), or acoustic detection components (e.g., microphones to identify tagged audio signals). In addition, a variety of information can be derived via the communication components 630, such as location via Internet Protocol (IP) geo-location, location via Wi-Fi® signal triangulation, location via detecting an NFC beacon signal that can indicate a particular location, and so forth.

The instructions 610 can be transmitted or received over the network 622 using a transmission medium via a network interface device (e.g., a network interface component included in the communication components 630) and utilizing any one of a number of well-known transfer protocols (e.g., hypertext transfer protocol (HTTP)). Similarly, the instructions 610 can be transmitted or received using a transmission medium via the coupling 640 (e.g., a peer-to-peer coupling) to devices 624. The term "transmission medium" shall be taken to include any intangible medium that is capable of storing, encoding, or carrying instructions 610 for execution by the device 600, and includes digital or analog communications signals or other intangible medium to facilitate communication of such software.

Figure 7:
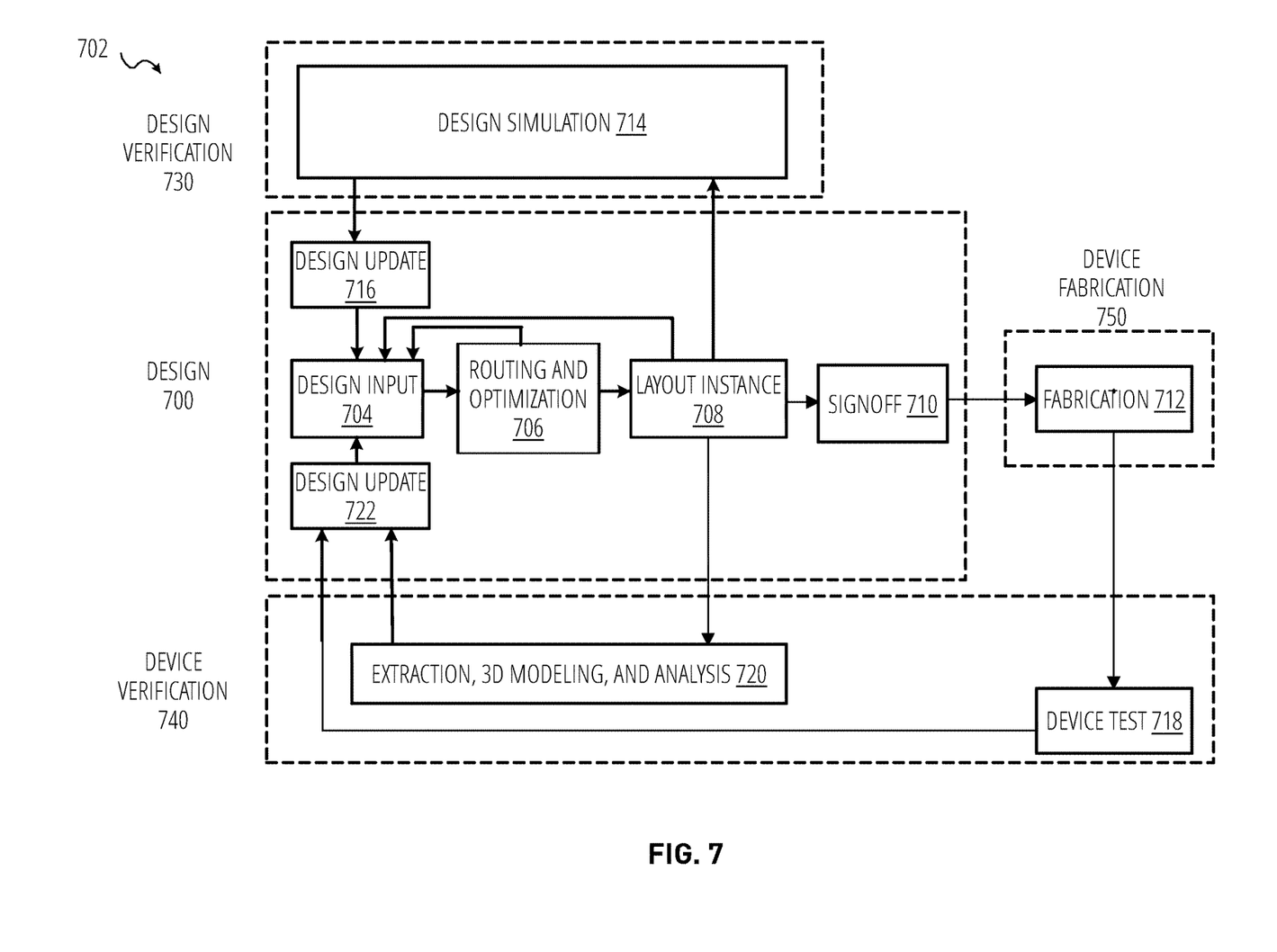
FIG. 7 is a diagram illustrating an example design process flow for generating a circuit that implements a digitally-controlled quadrature correction loop as described herein, and in various embodiments, to integrate the circuit with a larger circuit.

FIG. 7 is a diagram illustrating an example design process flow 702, according to some embodiments. As shown, the design process flow 702 includes a design phase 700, a device fabrication phase 750, a design verification phase 730, and a device verification phase 740. The design phase 700 involves an initial design input 704 operation where the basic elements and functionality of a device are determined, as well as revisions based on various analyses and optimization of a circuit design. This design input 704 operation is where block instances are used in the circuit design and any additional circuitry for the design around the blocks is selected. The initial strategy, tactics, and context for the device to be created are also generated in the design input 704 operation, depending on the particular design algorithm to be used.

In some embodiments, following an initial selection of design values in the design input 704 operation, routing, timing analysis, and optimization are performed in a routing and optimization 706 operation, along with any other automated design processes. While the design process flow 702 shows routing and optimization 706 occurring prior to a layout instance 708, routing, timing analysis, and optimization 706 can be performed at any time to verify operation of a circuit design. For instance, in various embodiments, timing analysis in a circuit design can be performed prior to routing of connections in the circuit design, after routing, during register transfer level (RTL) operations, or as part of a signoff 710, as described below.

After design inputs are used in the design input 704 operation to generate a circuit layout, and any of the routing and optimization 706 operations are performed, a layout is generated in the layout instance 708. The layout describes the physical layout dimensions of the device that match the design inputs. Prior to this layout being provided to a fabrication 712 operation, the signoff 710 is performed on the circuit design defined by the layout.

After signoff verification by the signoff 710, a verified version of the layout is used in the fabrication 712 operation to generate a device, or additional testing and design updates can be performed using designer inputs or automated updates based on design simulation 714 operations or extraction, 3D modeling, and analysis 720 operations. Once the device is generated, the device can be tested as part of device test 718 operations, and layout modifications generated based on actual device performance.

A design update 716 from the design simulation 714; a design update 722 from the device test 718 or the extraction, 3D modeling, and analysis 720 operations; or the design input 704 operation can occur after the initial layout instance 708 is generated. In various embodiments, whenever design inputs are used to update or change an aspect of a circuit design, a timing analysis and the routing and optimization 706 operation can be performed.

What is claimed is:

1. A clock signal correction circuit, comprising:
   a first duty cycle correction loop of a plurality of duty cycle correction loops, the first duty cycle correction loop coupled to a plurality of clock signals and configured to:
   receive a first set of clock signals from the plurality of clock signals; and
   correct a duty cycle of the first set of clock signals; and
   a first quadrature error correction loop of a plurality of quadrature error correction loops, the first quadrature error correction loop coupled to the plurality of clock signals and configured to:
   receive a second set of clock signals from the plurality of clock signals having a first phase and a second phase, the first and second phases being distinct; and
   correct a phase skew between the second set of clock signals; and
   a digital correction controller coupled to the first duty cycle correction loop and the first quadrature error correction loop, the digital correction controller configured to update the duty cycle correction and the quadrature error correction based at least in part on the first or second set of clock signals.

2. The circuit of claim 1, wherein the first duty cycle correction loop includes a duty cycle correction actuator, the first quadrature error correction loop includes a quadrature error correction actuator, and the duty cycle correction actuator and quadrature error correction actuator are configured to operate sequentially.

3. The circuit of claim 1, wherein the duty cycle correction loop includes a current mode logic to complementary metal-oxide-semiconductor (CML-CMOS) converter circuit.

4. The circuit of claim 3, wherein the duty cycle correction loop includes a first plurality of digitally controlled current sources coupled to the CML-CMOS converter circuit to apply a duty cycle correction by adjusting a drive strength of a pull-up transistor or a drive strength of a pull-down transistor.

5. The circuit of claim 3, wherein the duty cycle correction loop includes a second plurality of digitally configurable current sources coupled to the CML-CMOS converter circuit to configure a range of duty cycle corrections by adjusting a drive strength of a pull-up transistor and a drive strength of a pull-down transistor.

6. The circuit of claim 1, comprising:
   a logical operator configured to convert a quadrature phase error from the quadrature error correction loop into a duty-cycle error, the quadrature error correction loop receiving the quadrature phase error.

7. The circuit of claim 6, wherein the logical operator is an XOR gate.

8. The circuit of claim 6, wherein the duty cycle error and the quadrature phase error are sensed on differential clock signals.

9. The circuit of claim 8, wherein the duty cycle error and the quadrature phase error are sensed at respective duty cycle error and quadrature error sensing points, wherein each of the duty cycle error and quadrature error sensing points outputs a respective digital error code as inputs for the digital correction controller.

10. The circuit of claim 1, wherein the duty cycle error is sensed at a first location within the circuit and the quadrature phase error is sensed at the first location within the circuit.

11. The circuit of claim 10, wherein the digital correction controller is configured to:
    select a location within the circuit for duty cycle error correction based on one or more duty cycle error sensing points; and
    select a second location within the circuit for quadrature error correction based on one or more quadrature error sensing points.

12. The circuit of claim 1, wherein the quadrature error correction is implemented using one or more CML blenders.

13. The circuit of claim 12, wherein the CML blenders receive a calibration code to configure a range of input signal frequencies.

14. A method, comprising:
    correcting, by an error correction circuit, a duty cycle error between a first clock signal and a second clock signal;
    correcting, by the error correction circuit, a quadrature error between a third clock signal and a fourth clock signal, the error correction circuit comprising:
    a clock generator configured to generate a plurality of clock signals;
    a duty cycle correction loop configured to correct a duty cycle error between the first and second clock signals from the clock generator; and
    a quadrature error correction loop configured to correct a quadrature error between the third and fourth clock signals from the clock generator.

15. The method of claim 14, wherein the third clock signal is a differential clock signal, and the fourth clock signal is a separate differential clock signal.

16. The method of claim 14, further comprising: generating, by the duty cycle correction loop, a first corrected clock signal; updating, by a digital correction controller, the duty cycle correction loop based at least in part on the first corrected clock signal.

17. The method of claim 16, further comprising: generating, by the quadrature error correction loop, a second corrected clock signal; updating, by the digital correction controller, the quadrature error correction loop based at least in part on the second corrected clock signal.

18. A non-transitory computer-readable storage medium comprising instructions that, when executed by one or more processors of a computing device, cause the computing device to generate a circuit design by performing operations comprising:

configuring, in a circuit design, a clock generator configured to provide a plurality of clock signals;

configuring, in the circuit design, one or more duty cycle correction loops configured to apply duty cycle corrections to differential clock signals; and configuring, in the circuit design, one or more quadrature error correction loops configured to apply quadrature error corrections to quadrature clock signals; and configuring, in the circuit design, a digital correction controller configured to update the duty cycle correction and the quadrature error correction based at least in part on the clock signal.

19. The storage medium of claim 18, wherein a first duty cycle correction loop includes a duty cycle correction actuator, a first quadrature error correction loop includes a quadrature error correction actuator, and the duty cycle correction actuator and quadrature error correction actuator are configured to operate sequentially.

20. The storage medium of claim 18, wherein the duty cycle correction loop includes a current mode logic to complementary metal-oxide-semiconductor (CML-CMOS) converter circuit.

\* \* \* \* \*